(12) United States Patent
Nishimura et al.

(10) Patent No.: US 6,436,756 B1
(45) Date of Patent: Aug. 20, 2002

(54) SEMICONDUCTOR DEVICE AND FABRICATION METHOD THEREOF

(75) Inventors: Takeshi B. Nishimura; Naotaka Iwata, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/187,610

(22) Filed: Nov. 6, 1998

(30) Foreign Application Priority Data

Nov. 10, 1997 (JP) ............................................... 9-307256

(51) Int. Cl.[7] .......................................... H01L 21/8242
(52) U.S. Cl. ............................ 438/240; 438/3; 438/239; 438/393
(58) Field of Search ............................ 438/3, 239, 240, 438/241, 250, 253, 381, 393, 396

(56) References Cited

U.S. PATENT DOCUMENTS 4,811,076 A * 3/1989 Tigelaar et al. ................ 357/51
4,918,454 A * 4/1990 Early et al. .................. 341/172
5,304,506 A 4/1994 Porter et al.
5,736,421 A * 11/1994 Shimomura et al. ........ 438/253

FOREIGN PATENT DOCUMENTS

| JP | 4-229646 | 8/1992 |
| JP | 6-120425 | 4/1994 |
| JP | 7-221268 | 8/1995 |
| JP | 8-139273 | 5/1996 |
| JP | 8-340083 | 12/1996 |
| JP | 9-82896 | 3/1997 |
| JP | 9-102585 | 4/1997 |
| JP | 9-289287 | 11/1997 |

* cited by examiner

Primary Examiner—Carl Whitehead, Jr.
Assistant Examiner—Jeff Vockrodt
(74) Attorney, Agent, or Firm—Katten Muchin Zavis Rosenman

(57) ABSTRACT

In order to form a first capacitor having a small capacitance and a second capacitor having a large capacitance on a substance with a minimum number of manufacturing steps, at least one of electrodes of the first capacitor and at least one of electrodes of the second capacitor are formed simultaneously.

3 Claims, 3 Drawing Sheets

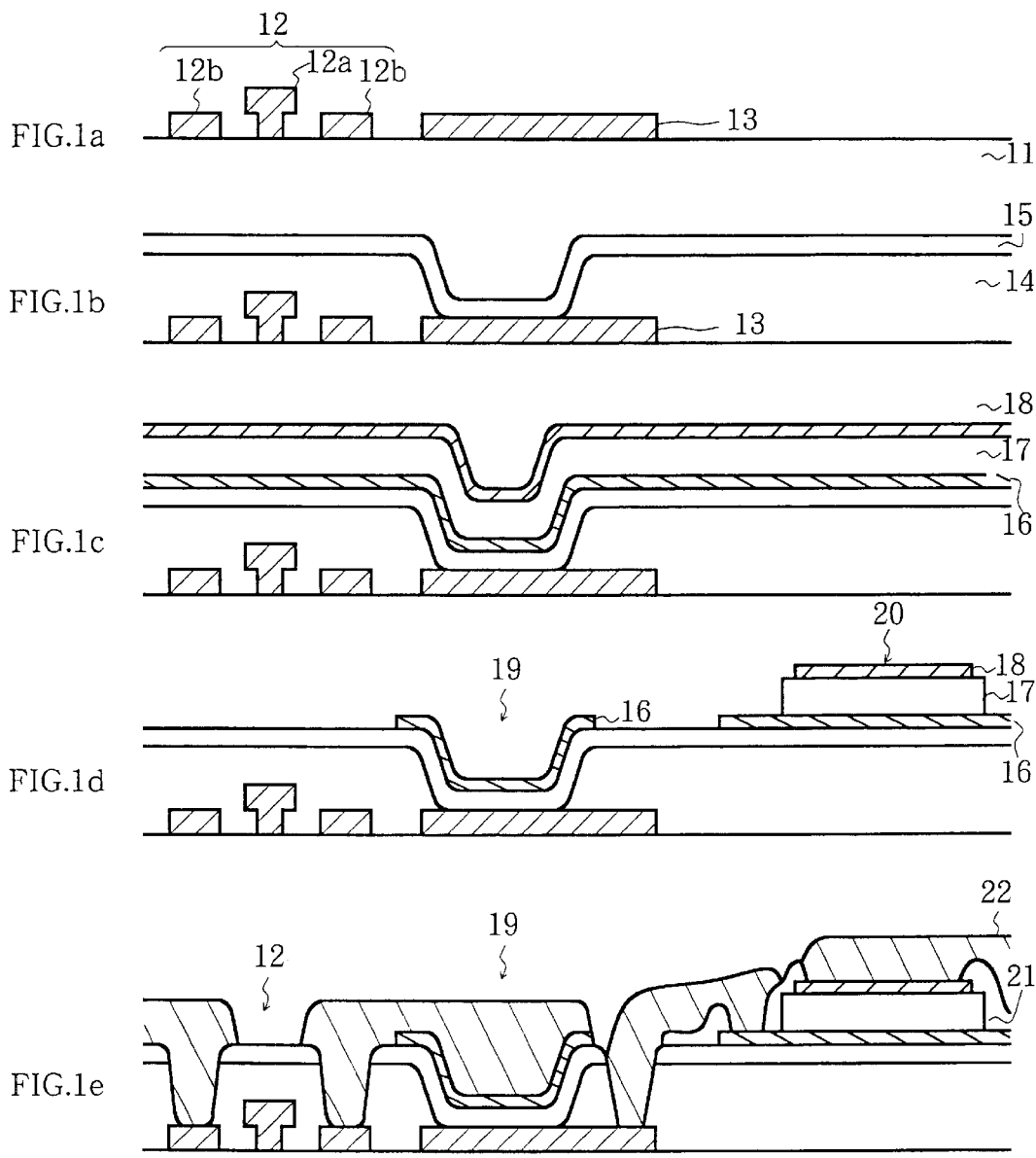

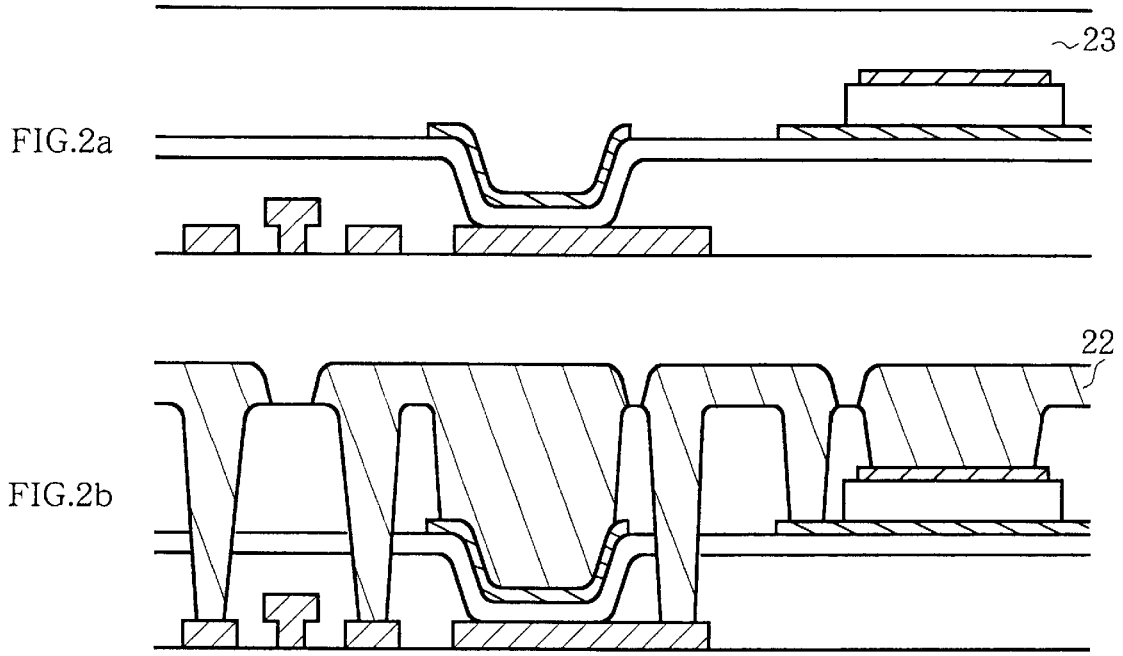

SEMICONDUCTOR DEVICE AND FABRICATION METHOD THEREOF

CROSS REFERENCE TO RELATED APPLICATIONS

The present invention claims priority from Japanese Patent Application No.9-288467 filed Oct. 21, 1997, the contents of which are incorporated herein by reference.

BACKGROUND OF THE INVENTION

1. Field of the Invention

The present invention relates to a gallium-arsenide integrated circuit for use in a micro wave circuit and, particularly, to a technique for integrating a large capacitor formed of high dielectric constant material and a small capacitor formed of a dielectric material having relatively low dielectric constant.

2. Description of Related Art

In a gallium-arsenide (GaAs) integrated circuit for use in a micro wave circuit, a field effect transistor (FET), a large capacitor used for a power source or used as a coupling capacitor and a small capacitor necessary in matching circuits have been integrated. As a dielectric material between electrodes of a large capacitor, a thin film of $SrTiO_3$(STO), $BaTiO_3$, $[Ba_xSr_{1-x}]TiO_3$(BST), $PbTiO_3$ or $[PbZr]TiO_3$ (PZT), etc., whose relative dielectric constant is 100 or more is used. $SiN_x$ having relative dielectric constant as low as about 7 is used as a dielectric material between electrodes of a small capacitor.

Japanese Patent Application Laid-open No. Hei 6-120425 discloses an integration of FET and capacitors. According to the disclosed technique, the FET is formed first and, then, the large capacitor is formed by using high dielectric constant material.

However, since, in the disclosed technique, the FET and the capacitor are formed separately, the number of manufacturing steps is increased. Further, in order to form the capacitor having different capacity, other manufacturing steps are required.

SUMMARY OF THE INVENTION

An object of the present invention is to provide a semiconductor device which is an integrated circuit including capacitors having substantially different capacitances and a manufacturing method for manufacturing the semiconductor device with a smaller number of manufacturing steps.

According to a first aspect of the present invention, an upper electrode of a capacitor having small capacitance (referred to as "small capacitor", hereinafter) and a lower electrode of a capacitor having large capacitance (referred to as "large capacitor", hereinafter) are formed simultaneously. That is, after a film of low dielectric constant material is formed on a lower electrode of the small capacitor, the upper electrode of the small capacitor and the lower electrode of the large capacitor are formed simultaneously and a film of high dielectric constant material and the upper electrode are laminated on the lower electrode of the large capacitor. Thus, a semiconductor device in which the upper electrode of the small capacitor and the lower electrode of the large capacitor are formed as different regions of the same conductive film. It is enough that dielectric constant of the film of low dielectric constant material is lower than dielectric constant of the film of high dielectric constant material formed on the lower electrode of the large capacitor. The conductive film may be of a metal material or a conductive oxide material.

It is preferable to form an active elements on a substrate and form the lower electrode of the small capacitor simultaneously with the formation of electrodes of the active element.

In detail, at the time of formation of the electrode, for example, a gate electrode of the active element, the metal film is left on a portion of the substrate. The active element and the metal film are covered by an inter-layer film. An opening is formed in the inter-layer film such that a portion of the metal film is exposed. On the wafer, a dielectric film of a dielectric material having low dielectric constant (referred to as "low dielectric constant film", hereinafter), a first conductive film, a dielectric film of a dielectric material having high dielectric constant (referred to as "high dielectric constant film", hereinafter) and a second conductive film are formed in the order. The large capacitor is formed by processing the second conductive film, the high dielectric constant film and the first conductive film and the small capacitor is formed by removing the second conductive film and the high dielectric constant film correspondingly to the position of the metal film and processing the first conductive film.

According to a second aspect of the present invention, the dielectric material between the electrodes of the small capacitor has a double layer structure composed of a high dielectric constant film and a low dielectric constant film, the low dielectric constant film of the large capacitor is removed and the lower electrodes of the small and large capacitors are formed simultaneously and the upper electrodes of the small and large capacitor are formed simultaneously. That is, the lower electrode of the small capacitor and the lower electrode of the large capacitor are formed simultaneously and the high dielectric constant film and the low dielectric film are formed on these lower electrodes in the order. The low dielectric constant film in a region in which the large capacitor is to be formed is removed and the upper electrodes of the small and large capacitors are simultaneously formed on the low dielectric constant film in a region in which the small capacitor is to be formed and on the high dielectric constant film in the region in which the large capacitor is to be formed. Thus, the semiconductor device including the small and large capacitors having the simultaneously formed lower electrodes, the high dielectric constant film simultaneously formed as the inter-electrode dielectric layer, the low dielectric constant film formed in the inter-electrode layer of only the small capacitor and the upper electrodes formed simultaneously as the same conductive film.

It is preferable to form at least one active element and to form the lower electrodes of the small and large capacitors simultaneously with a formation of an electrode of the active element.

In detail, the active element is formed on the substrate, a metal film used to form the electrode of the active element is left on at least two portions of said substrate, the active element and the metal film are covered by an inter-layer film, openings are formed in the two regions of the inter-layer film to expose portions of the metal film, a second dielectric film having a high dielectric constant and a first dielectric film having a low dielectric constant are laminated, the first dielectric film is removed from one of the two regions, in which the large capacitor is to be formed, and the small capacitor and the large capacitors are formed in the region in which the low dielectric constant film exists and the large capacitor is formed in the region from which the low dielectric constant film is removed, by processing the conductive film.

BRIEF DESCRIPTION OF THE DRAWINGS

The above and other objects, features and advantages of the present invention will become more apparent by reference to the following detailed description of the invention taken in conjunction with the accompanying drawings, in which:

FIGS. 1a to 1e are cross sections of a semiconductor device, showing manufacturing steps according to a first embodiment of the present invention;

FIGS. 2a and 2b are cross sections of a semiconductor device, showing manufacturing steps according to a second embodiment.

DETAILED DESCRIPTION OF THE PREFERRED EMBODIMENTS

Figure 3A:
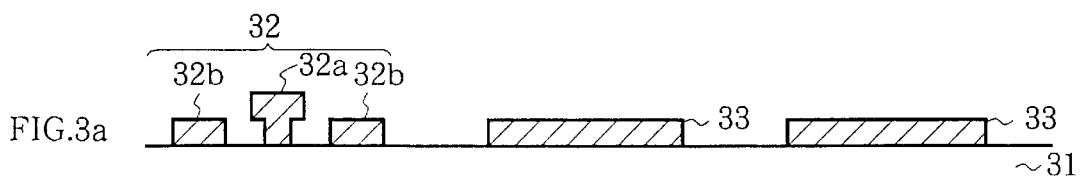
FIGS. 3a to 3e are cross sections of a semiconductor device, showing manufacturing steps according to a third embodiment of the present invention.

FIGS. 1a to 1e are cross sections of a semiconductor device composed of a GaAs substrate and an FET, a small capacitor and a large capacitor formed on the substrate, showing manufacturing steps according to a first embodiment of the present invention.

According to the first embodiment of the present invention, the FET 12 having a gate electrode 12a and an ohmic electrode 12b is formed on the GaAs substrate 11 and, in forming the gate electrode 12a of the FET 12, a metal film 13 is left on a portion of the GaAs substrate 11, as shown in FIG. 1a. In this embodiment, the gate electrode 1 2a and the metal film 13 are sputtered Au/WSi films.

Then, as shown in FIG. 1b, the FET 12 and the metal film 13 are covered by a $SiO_2$ inter-layer film 14, an opening is formed in the $SiO_2$ inter-layer film 14 to expose a portion of the metal film 13 and a low dielectric constant film 15 is formed on the whole wafer. In this embodiment, the low dielectric constant film 15 is a $SiN_x$ film formed by plasma CVD.

Then, as shown in FIG. 1c, a first conductive film 16, a high dielectric constant film 17 and a second conductive film 18 are formed in lamination. The first conductive film 16 has a double layer structure having an upper Ti layer portion 20 nm thick and a lower Pt layer portion 70 nm thick and the high dielectric constant film 17 is of STO. The close adhesion between Ti and $SiN_x$ is high and the reaction of Pt to STO is small. In this embodiment, the second conductive film 18 is a Pt of TiN film 100 nm thick.

Thereafter, as shown in FIG. 1d, the second conductive film 18, a large capacitor 20 is formed by processing the high dielectric constant film 17 and the first conductive film 16. Simultaneously, the second conductive film 18 and the high dielectric constant film 17 are removed correspondingly to the metal film 13 and a small capacitor 19 is formed by further processing the first conductive film 16. In this case, the first conductive film 16 forms an upper electrode of the small capacitor 19 and a lower electrode of the large capacitor 20.

Then, as shown in FIG. 1e, the large capacitor 20 is buried by an inter-layer film 21. Then, through-holes are formed in respective portions of the inter-layer film 21 on the lower electrode (first conductive film 16) of the small capacitor 19 and the upper electrode (second conductive film 18) of the large capacitor 20 and through-holes are formed in the low dielectric constant film 15 and the inter-layer film, respectively, such that the gate electrode 12a of the FET and the lower electrode (metal film 13) of the small capacitor 19, resulting in a wiring 22. In the shown example, one of electrodes of the FET 12 is connected to the upper electrode of the small capacitor 19, the lower electrode of the small capacitor 19 is connected to the lower electrode of the large capacitor 20 and the upper electrode of the large capacitor 20 is connected to other elements mounted on the same substrate.

FIGS. 2a and 2b are cross sections of a semiconductor device according to a second embodiment of the present invention, showing manufacturing steps subsequent to the manufacturing step shown in FIG. 1d. In this embodiment, after the small capacitor and the large capacitor are formed, the wafer surface is flattened by burying them by an inter-layer film 23 as shown in FIG. 2a and, then, the wiring 22 is formed by forming through-holes in the positions of the respective electrodes of the FET, the small capacitor and the large capacitor, as shown in FIG. 2b.

FIGS. 3a to 3e are cross sections of a semiconductor device having an FET, a small capacitor and a large capacitor, showing manufacturing steps according to a third embodiment of the present invention.

In this embodiment, the FET 32 having a gate electrode 32a and an ohmic electrode 32b is formed on the substrate 31 and, in forming the gate electrode 32a of the FET 32, a metal film 33 is left on at least two regions of the substrate 31 for use as lower electrodes of the small and large capacitors, as shown in FIG. 3a.

Figure 3B:

Then, as shown in FIG. 3b, the FET 32 and the metal film 33 are covered by an inter-layer film 34, an opening is formed in the inter-layer film 34 to expose a portion of the metal film 33.

Figure 3C:
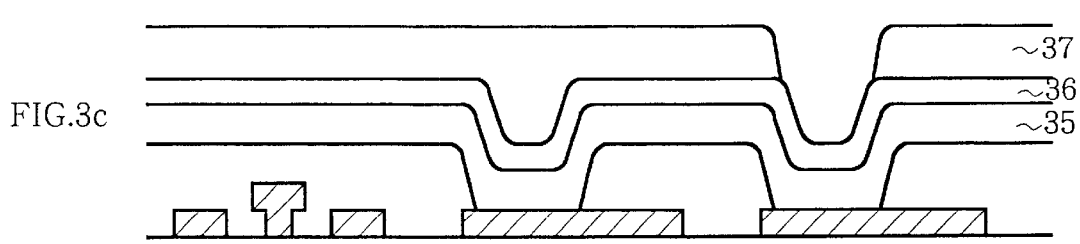
Figure 3D:
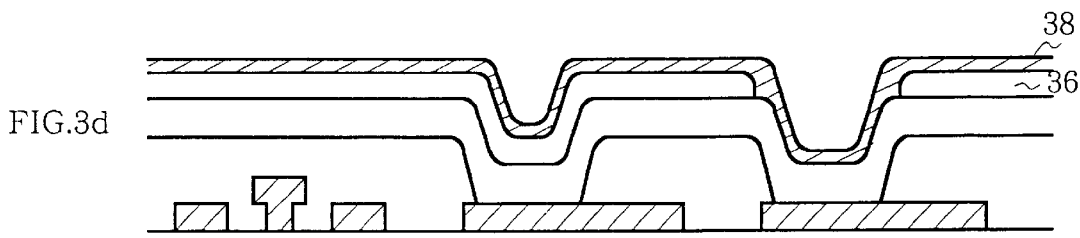

Then, as shown in FIG. 3c, a high dielectric constant film 35 and a low dielectric constant capacitor 36 are laminated and the low dielectric constant film 36 in a region in which the large capacitor is to be formed is removed by dry-etching using a photo resist 37 as a mask. After the low dielectric constant film 36 is removed, the photo resist 37 is removed and a first conductive film 38 having thickness of 100 nm is formed as shown in FIG. 3d.

Figure 3E:
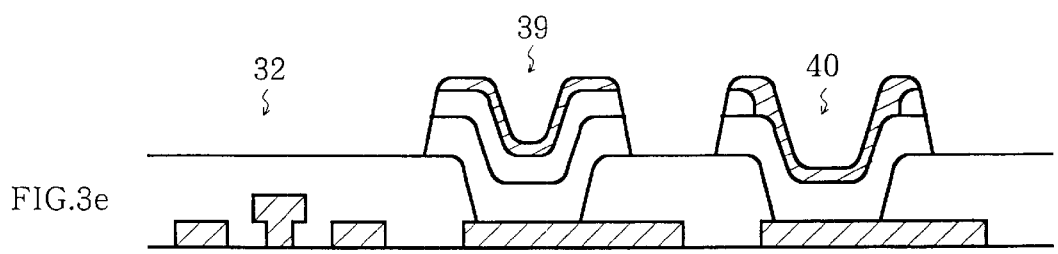

Then, as shown in FIG. 3e, the first conductive film 38, the low dielectric constant film 36 and the high dielectric constant film 35 on other regions than the region in which the small and large capacitors are to be formed. Thus, a small capacitor 39 having the high dielectric constant film 35 and the low dielectric constant film 36 as a dielectric layer provided between the upper and lower electrodes and a large capacitor 40 having the high dielectric constant film 35 provided between the upper and lower electrodes are obtained. Finally, a wiring is formed in a similar manner to the steps shown in FIG. 1e or 2b.

As described hereinbefore, according to the present invention in which at least one of electrodes of a first capacitor and at least one of electrodes of a second capacitor having dielectric constant different from that of the first capacitor are formed simultaneously, the manufacturing process can be simplified compared with the case where these capacitors are formed separately. Particularly, when a lower electrode of a capacitor and an upper electrode of another capacitor are formed simultaneously, the manufacturing process can be substantially simplified compared with the conventional manufacturing process.

What is claimed is:

1. A method for manufacturing a semiconductor device having a first capacitor having a small capacitance and a second capacitor having a large capacitance formed on a single substrate, comprising the steps of:

forming a first dielectric film having a low dielectric constant on a lower electrode of said first capacitor and forming an upper electrode of said first capacitor and a lower electrode of said second capacitor on said first dielectric film, simultaneously from a double-layered conductive film; and forming a second dielectric film having a high dielectric constant on said lower electrode of said second capacitor and forming an upper electrode of said second capacitor on said second dielectric film.

2. A method as claimed in claim 1, further comprising the step of forming an active element on said substrate, wherein said lower electrode of said first capacitor is formed simultaneously with a formation of an electrode of said active element.

3. A method for manufacturing a semiconductor device having a first capacitor having a small capacitance and a second capacitor having a large capacitance formed on a single substrate, comprising the steps of:

forming a first dielectric film having a low dielectric constant on a lower electrode of said first capacitor and forming an upper electrode of said first capacitor and a lower electrode of said second capacitor on said first dielectric film, simultaneously; and forming a second dielectric film having a high dielectric constant on said lower electrode of said second capacitor and forming an upper electrode of said second capacitor on said second dielectric film, and further comprising the steps of:

forming an active element on said substrate, wherein said lower electrode of said first capacitor is formed simultaneously with a formation of an electrode of said active element;

leaving a metal film used to form said electrode of said active element on a portion of said substrate;

covering said active element and said metal film by an inter-layer film;

forming an opening in said inter-layer film to expose a portion of said metal film;

forming said first dielectric film, forming a first conductive film on said first dielectric film, forming said second dielectric film on said first conductive film and forming a second conductive film on said second dielectric film; and forming said second capacitor by processing said second conductive film, said second dielectric film and said first conductive film and forming said first capacitor by removing said second conductive film and said second dielectric film on said metal film and processing said first conductive film.

\* \* \* \* \*